United States Patent
Ivanov et al.

(10) Patent No.: US 8,228,130 B1
(45) Date of Patent: Jul. 24, 2012

(54) CIRCUITRY AND METHOD FOR PRECISION AMPLITUDE CONTROL IN QUARTZ AND MEMS OSCILLATORS

(75) Inventors: Vadim V. Ivanov, Tucson, AZ (US); Michael J. Shay, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/931,940

(22) Filed: Feb. 15, 2011

(51) Int. Cl.
*G04C 3/06* (2006.01)
*H03B 5/32* (2006.01)

(52) U.S. Cl. ............ 331/116 M; 331/96; 331/154; 331/109; 331/175; 331/107 A

(58) Field of Classification Search .......... 331/116 M, 331/154, 96, 109, 175, 107 A
See application file for complete search history.

(56) References Cited

U.S. PATENT DOCUMENTS

| | | | |
|---|---|---|---|
| 6,741,137 B1 | 5/2004 | Sibrai et al. | 331/109 |
| 6,956,443 B2 | 10/2005 | Ruffieux | 331/158 |
| 7,170,201 B2 * | 1/2007 | Hamel et al. | 307/151 |
| 7,292,095 B2 | 11/2007 | Burt et al. | 330/9 |
| 7,443,257 B2 * | 10/2008 | Demma | 331/116 M |

OTHER PUBLICATIONS

"High Frequency Microelectromechanical IF Filters" by Bannon et al., 1996 IEEE, pp. 30.4.1-30.4.4.
"High-Performance Crystal Oscillator Circuits: Theory and Application" by Vittoz et al., 1998 IEEE, pp. 774-783.

* cited by examiner

*Primary Examiner* — Arnold Kinkead
(74) *Attorney, Agent, or Firm* — John J. Patti; Wade J. Brady, III; Frederick J. Telecky, Jr.

(57) ABSTRACT

An oscillator includes oscillator circuitry (8) including a transconductance stage (2) and a resonator (3). A comparator (10) produces first (CLK) and second (/CLK) clock signals which indicate the timing of positive and negative phases of a differential output signal ($V_{IN}^+ - V_{IN}^-$) produced by the transconductance circuit in response to the resonator. A synchronous rectifier (14) converts the differential output signal to a current ($I_{RECT}$) in response to the first and second clock signals. A switched capacitor notch filter (15) filters the current in response to the first and second clock signals. A control current ($I_{CONTROL}$) which controls the transconductance of the transconductance circuit is generated in response to the notch filter. The resonator may be a MEMS resonator.

20 Claims, 5 Drawing Sheets

CIRCUITRY AND METHOD FOR PRECISION AMPLITUDE CONTROL IN QUARTZ AND MEMS OSCILLATORS

BACKGROUND OF THE INVENTION

The present invention relates generally to oscillators, and more particularly to improving amplitude control and frequency stability in oscillators which include on-chip MEMS (micro electromechanical) resonators.

The closest prior art includes the article "High performance crystal oscillator circuits" by E. Vittoz et al, JSSC vol. 23, no. 3, June 1988 pp. 774-783. FIG. 11 of this reference is essentially reproduced in subsequently described Prior Art FIG. 1. The techniques disclosed in the Vittoz article are widely used. (In Prior Art FIG. 1, note that the same reference characters are used as in FIG. 11 of the Vittoz article.)

In the high-performance quartz oscillator shown in Prior Art FIG. 1, terminals Q1 and Q2 are connected to a quartz resonator, as indicated by dashed lines. An AC signal V1 is produced on terminal Q1 and a signal V2 is produced on terminal Q2. The AC output current $I_O$ produced by oscillator circuitry including P-channel MOS transistors M1, M15, M17 and M19 and N-channel current mirror output transistors M10 and M2 is mirrored, by means of N-channel transistor M8 of an amplitude regulator circuit, to the drain and gate of a P-channel transistor M9 and to the gates of P-channel transistors M37 and M39 of the amplitude regulator circuit. P-channel transistors M3 and M5 and N-channel transistors M4 and M6, and resistor R7 also are included in the amplitude regulator circuit. An output voltage regulator includes P-channel transistors M21, M25, M27, M33, M29, M33, and M35 and N-channel transistors M22, M20, M24, M26, and M32.

The AC signal generated in the high-performance quartz oscillator of Prior Art FIG. 1 passes through the diode string including transistors M37 and M39, each of which actually functions as a resistor, the resistance of which is determined by its gate voltage, that is, by the voltage across diode-connected P-channel transistors M7 and M9. Transistor M37 provides DC feedback for transistor M3, so that it functions as a peak detector, with capacitor C11 functioning as a filter. The current in transistor M3, which corresponds to the peak value of the input voltage V1 on terminal Q1, is compared to the current through transistor M4 and then is filtered by the low pass circuitry including transistor M39 and capacitors C4 and C5. The result of the above mentioned comparison is to change the current through transistor M5. The current in transistor M5 is mirrored to increase the current through transistor M1 and to increase the oscillation amplitude. Resistor R7 decreases the gain of transistor M5 gain to provide improved loop stability. The AC signal V1 on terminal Q1 passes from the oscillator circuit through capacitors C1 and C7 to the gate of transistor M9. This results in an AC signal at the gate and drain of transistor M9. The input signal V1 on terminal Q1 also passes through capacitor C7 and creates an AC current through transistor M9. The current through transistor M9 is, in effect, compared to the current in current mirror output transistor M4. The RC filter formed by transistor M39 and capacitor C4, along with the regulator currents through transistors M4 and M5, functions to regulate the amplitude of the oscillator signal V1, and consequently the RC filter and the regulator currents through transistors M4 and M5 also regulate the voltage across capacitor C1 and the current through the quartz resonator. (The current through the quartz resonator is equal to the voltage across the capacitors C1 multiplied by the capacitive reactance of capacitor C1.)

The heart of the Pierce oscillator circuit in Prior Art FIG. 1 uses transistor M1 in a grounded source configuration, with the resonator connected between terminals Q1 and Q2. Transistor M1 is biased by current $I_O$ delivered via current mirror output transistor M2 from the amplitude regulator circuit by means of current mirror input transistor M6. Transistor M17 is operated in weak inversion as a resistor that forces transistor M1 into its active mode and therefore must have a very high resistance to avoid degrading the frequency stability and increasing the current. The resistance of transistor M17 is determined by the biasing transistors M15 and M19, which are matched to transistors M1 and M17.

The amplitude regulator circuit in Prior Art FIG. 1 is based on known circuitry in which high-value resistors are implemented by transistors M17 and M39 that are biased by transistors M7 and M9. In the absence of oscillation, the output voltage regulator behaves as a current reference which delivers a start-up current to the oscillator. As the oscillation amplitude increases, the current $I_O$ decreases until the amplitude of the AC voltage V1 at terminal Q1 reaches a value solely determined by the low current gain of the loop including transistors M3-M6, if transistors M3 and M5 are in weak inversion. This amplitude can be adjusted to a higher value by the capacitive divider C7,C11. The output amplifier is a simple CMOS inverter including transistors M13 and M14 and is biased in its active mode by the matched inverter including transistors M11 and M12 and by transistor M23. It is capacitively coupled to terminal Q1. The total gate-to-drain capacitance $C_M$ of transistors M13 and M14 causes an input conductance G1 to load the oscillator, which can be evaluated as described in the Vittoz article.

In Prior Art FIG. 1, the regulating signal $I_O$ generated by the amplitude regulator circuit is the biasing current of the single transistor M1 of the Pierce oscillator. That biasing current $I_O$ determines the transconductance of transistor M1 and hence the transconductance of the oscillator circuit, and therefore controls the amplitude of the AC signal V1 being generated.

In quartz oscillators, an excitation voltage signal is generated inside the crystal by the piezo effect, so quartz resonators do not need a separate excitation signal. The amplitude of this piezo-generated excitation signal is so large that small amplitude variations do not cause significant change in frequency. Therefore, the amplitude regulator circuit in Prior Art FIG. 1 provides very crude voltage amplitude control because, for example, the frequency of oscillation will be the same whether the amplitude is equal to 1 volt or 100 millivolts. The oscillation frequency of a quartz oscillator is far less sensitive to amplitude variations than oscillators which include MEMS resonators, and the amplitude regulator circuit of a quartz oscillator therefore needs to provide only enough regulation to keep the circuit in its linear operating range.

Unfortunately, the amplitude control circuitry in the widely used quartz oscillator circuit of Prior FIG. 1 circuit uses translinear relationships in MOS (or bipolar) transistors. Such relationships are highly affected by component matching and temperature. The accuracy of the amplitude regulation of quartz oscillators of the prior art is very poor, typically only tens of millivolts, and is not acceptable for high-performance silicon MEMS oscillators.

Thus, there is an unmet need for a high performance oscillator circuit and method that provide much more precise regulation of oscillator frequency than has been achieved in the prior art.

There also is an unmet need for a high performance MEMS oscillator circuit and method that provide much more precise regulation of oscillator frequency than has been achieved in the prior art.

There also is an unmet need for a high performance MEMS oscillator circuit and method that provide much more precise regulation of oscillator frequency than has been achieved in the prior art, without requiring complex compensation of circuitry for regulating the amplitude of an AC signal produced by the oscillator circuit.

SUMMARY OF THE INVENTION

It is an object of the invention to provide a high performance oscillator circuit and method that provide much more precise regulation of oscillator frequency than has been achieved in the prior art.

It is another object of the invention to provide a high performance MEMS oscillator circuit and method that provide much more precise regulation of oscillator frequency than has been achieved in the prior art.

It is another object of the invention to provide a high performance MEMS oscillator circuit and method that provide much more precise regulation of oscillator frequency than has been achieved in the prior art, without requiring complex compensation of circuitry for regulating the amplitude of an AC signal produced by the oscillator circuit.

Briefly described, and in accordance with one embodiment, the present invention provides an oscillator which includes oscillator circuitry (8) including a transconductance stage (2) and a resonator (3). A comparator (10) produces first (CLK) and second (/CLK) clock signals which indicate the timing of positive and negative phases of a differential output signal ($V_{IN}^+$-$V_{IN}^-$) produced by the transconductance circuit in response to the resonator. A synchronous rectifier (14) converts the differential output signal to a current ($I_{RECT}$) in response to the first and second clock signals. A switched capacitor notch filter (15) filters the current in response to the first and second clock signals. A control current ($I_{CONTROL}$) which controls the transconductance of the transconductance circuit is generated in response to the notch filter. The resonator may be a MEMS resonator.

In one embodiment, the invention provides an oscillator (1) including oscillator circuitry (8) containing an amplifying circuit (2) having first (6) and second (7) outputs and also a resonator (3) having a first terminal (3A) for receiving a bias signal. A comparator (10) has first and second inputs coupled to the first (6) and second (7) outputs, respectively, of the amplifying circuit (2) to produce first (CLK) and second (/CLK) clock signals which indicate the timing of positive and negative phases of a differential output signal ($V_{IN}^+$-$V_{IN}^-$) produced by the amplifying circuit (2). A synchronous rectifier (14) has first (12) and second (13) inputs coupled to receive first ($V_{IN}^+$) and second ($V_{IN}^-$) output signals that are produced in response to the first (6) and second (7) outputs of the amplifying circuit (2). The synchronous rectifier (14) has first (18) and second (19) clock inputs coupled to receive the first (CLK) and second (/CLK) clock signals, respectively. A switched capacitor notch filter (15) has an input (21) coupled to an output ($V_{21}$) of the synchronous rectifier (14). The switched capacitor notch filter (15) has first (18) and second (19) clock inputs coupled to receive the first (CLK) and second (/CLK) clock signals, respectively. A control current generator (26) has an input coupled to an output ($V_{OUT}$) of the switched capacitor notch filter (15), to generate a control current ($I_{CONTROL}$) which controls the transconductance of the amplifying circuit (2).

In a described embodiment, the resonator (3) is a MEMS resonator. The amplifying circuit (2) includes a transconductance stage (5) having a first input (+) coupled to a first terminal of a first capacitor (C0) and a second terminal (7) of the MEMS resonator (3) and a second input (−) coupled to a second terminal of the first capacitor (C0) and the first output (6) of the amplifying circuit (2).

In one embodiment, a buffer circuit (11) has first and second inputs coupled to the first (6) and second (7) outputs, respectively, of the amplifying circuit (2) for producing the first ($V_{IN}^+$) and second ($V_{IN}^-$) output signals.

In one embodiment, the synchronous rectifier (14) includes first (M0), second (M1), third (M2), fourth (M3), fifth (M4), and sixth (M4A) transistors and first (S0), second (S1), third (S2), fourth (S3), fifth (S4) and sixth (S5) switches. The first transistor (M0) has a gate coupled to receive the first output signal ($V_{IN}^+$), a source coupled to a first current source (I0), a first terminal of a resistor (R0), and a first terminal of the first switch (S0), and a drain coupled to a first terminal of the second switch (S1), a first terminal of the third switch (S2), and a drain of the third transistor (M2). A source of the third transistor (M2) is coupled to a first supply voltage ($V_{SS}$). The second transistor (M1) has a gate coupled to receive the second output signal ($V_{IN}^-$), a source coupled to a second current source (I1), a second terminal of the resistor (R0), and a first terminal of the fourth switch (S3), and a drain coupled to a first terminal of the fifth switch (S4), a first terminal of the sixth switch (S5), and a drain of the fourth transistor (M3). A source of the fourth transistor (M3) is coupled to the first supply voltage ($V_{SS}$). Second terminals of the first (S0) and fourth (S3) switches are coupled to a drain of the fifth transistor (M4). Second terminals of the third (S2) and sixth (S5) switches are coupled to gates (36) of the third (M2) and fourth (M6) transistors. Second terminals of the second (S1) and fifth (S4) switches are coupled to gates of the fifth (M4) and sixth (M4A) transistors. Sources of the fifth (M4) and sixth (M4A) transistors are coupled to the first supply voltage ($V_{SS}$). A drain of the sixth transistor (M4A) is coupled by an output conductor (21) to one terminal of a reference current source ($I_{REF}$). The third (S2), fourth (S3) and fifth (S4) switches are controlled by the first clock signal (CLK), and the first (S0), second (S1), and sixth (S5) switches are controlled by the second clock signal (/CLK).

In one embodiment, the notch filter (15) includes seventh (S10), eighth (S11), ninth (S12), and tenth (S13) switches. The output ($V_{21}$) of the synchronous rectifier (14) is coupled to a first terminal of each of the seventh (S10) and eighth (S11) switches, a second terminal (40) of the seventh switch (S10) is coupled to a first terminal of the ninth switch (S12) and a first terminal of a first capacitor (C4), and a second terminal (42) of the eighth switch (S11) is coupled to a first terminal of the tenth switch (S13) and a second capacitor (C3). Second terminals of the ninth (S12) and tenth (S13) switches are coupled to an output conductor (43) of the switched capacitor notch filter (15). The seventh (S10) and tenth (S13) switches are controlled by a third clock signal (F1). The eighth (S11) and ninth (S12) switches are controlled by a fourth clock signal (F2). The frequency of the third (F1) and fourth (F2) clock signals is half the frequency of the first (CLK) and second (/CLK) clock signals. The third clock signal (F1) is orthogonal to the first clock signal (CLK) and the fourth clock signal (F2) is orthogonal to the second clock signal (/CLK).

In one embodiment, a divide-by-two circuit (45) includes a flip-flop (46) having a clock input (48) coupled to receive the second clock signal (/CLK), an enable input (47), a Q output on which the third clock signal (F1) is produced, and a /Q output on which the fourth clock signal (F2) is produced. The /Q output is coupled to a D input of the flip-flop (46).

In one embodiment, control current generator (26) includes an output transistor (MN1) having a gate coupled to an output of the switched capacitor notch filter (15), a source coupled by a resistor (R4) to a supply voltage ($V_{SS}$), and a current mirror (26A) having an input coupled to a drain of the output transistor (MN1), and also includes an output coupled to control the transconductance of the amplifying circuit (2).

In one embodiment, the amplifying circuit (2) includes a first transistor (MP0) having a source coupled to receive the control current ($I_{CONTROL}$). The output transistor (MN1) may be an N-channel transistor and the first transistor (MP0) may be a P-channel transistor.

In a described embodiment, the MEMS resonator (3), the amplifying circuit (2), the comparator (10), the synchronous rectifier (14), the switched capacitor notch filter (15), and the control current generator (26) all are fabricated on an integrated circuit chip.

In one embodiment, the invention provides a method for controlling variation of an oscillator signal frequency, including producing an AC signal between first (+) and second (−) outputs of an amplifying circuit (2) in response to a resonator (3) having a first terminal (7) coupled to an input (+) of the amplifying circuit (2); generating complementary first (CLK) and second (/CLK) clock signals which indicate the timing of positive and negative phases of a differential output signal ($V_{IN}^+$-$V_{IN}^-$) produced in response to the amplifying circuit (2) by comparing signals on the first (+) and second (−) outputs of the amplifying circuit (2); synchronously rectifying the differential output signal ($V_{IN}^+$-$V_{IN}^-$) in response to the first (CLK) and second (/CLK) clock signals to produce a rectified signal ($V_{21}$,$I_{RECT}$) representative of the amplitude of the AC signal; filtering the rectified signal ($V_{21}$,$I_{RECT}$) by means of a switched capacitor notch filter (15) in response to third (F1) and fourth complementary (F2) clock signals; and generating a control current ($I_{CONTROL}$) in response to a filtered signal ($V_{OUT}$) generated by the filtering and applying the control current ($I_{CONTROL}$) to the amplifying circuit (2) to control the transconductance of the amplifying circuit (2).

In one embodiment, the method includes providing the resonator (3) as a MEMS (micro electromechanical system) resonator. In one embodiment, the method includes providing a flip-flop (46) having a clock input (48) coupled to receive the second clock signal (/CLK), an enable input (47), a Q output on which the third clock signal (F1) is produced, and a /Q output on which the fourth clock signal (F2) is produced, the /Q output being coupled to a D input of the flip-flop (46).

In one embodiment, the method includes fabricating the MEMS resonator (3), the amplifying circuit (2), the comparator (10), the synchronous rectifier (14), the switched capacitor notch filter (15), and the control current generator (26) all on a silicon integrated circuit chip.

In one embodiment, the method includes generating the control current generator (26) by means of an output transistor (MN1) having a gate coupled to an output of the switched capacitor notch filter (15) and a current mirror (26A) having an input coupled to a drain of the output transistor (MN1) and an output coupled to source of a transistor (MP0) in the amplifying circuit (2).

In one embodiment, the invention provides an oscillator (1) including circuitry for controlling variation of an oscillator signal frequency, including means (3,17,5) for producing an AC signal between first (+) and second (−) outputs of an amplifying circuit (2) in response to a resonator (3) having a first terminal (7) coupled to an input (+) of the amplifying circuit (2); means (10) for generating complementary first (CLK) and second (/CLK) clock signals which indicate the timing of positive and negative phases of a differential output signal ($V_{IN}^+$-$V_{IN}^-$) produced in response to the amplifying circuit (2) by comparing signals on the first (+) and second (−) outputs of the amplifying circuit (2); means (14) for synchronously rectifying the differential output signal ($V_{IN}^+$-$V_{IN}^-$) in response to the first (CLK) and second (/CLK) clock signals to produce a rectified signal ($V_{21}$,$I_{RECT}$) representative of the amplitude of the AC signal; means (15) for filtering the rectified signal ($V_{21}$,$I_{RECT}$) by means of a switched capacitor notch filter (15) in response to third (F1) and fourth complementary (F2) clock signals; and means (26) for generating a control current ($I_{CONTROL}$) in response to a filtered signal ($V_{OUT}$) generated by the filtering and applying the control current ($I_{CONTROL}$) to the amplifying circuit (2) to control the transconductance of the amplifying circuit (2).

DETAILED DESCRIPTION OF THE PREFERRED EMBODIMENTS

Many present digital circuit/system applications require very precise control of oscillator frequency to generate various clock signals and/or timing signals. MEMS resonators typically are fabricated in silicon integrated circuits and are compatible with ordinary CMOS fabrication processes. This means that a MEMS oscillator for generating a reference clock frequency for a complex digital circuit or system can be produced on the same chip with the digital circuit or system. In contrast, quartz crystals (or other crystals) used as resonators for oscillators must be provided in a separate package from the digital circuit or system, at considerable additional expense and with significant sacrifice of achievable performance.

Crystal oscillators and MEMS oscillators typically include a comparator which amplifies the AC signal being generated by the oscillator to provide a corresponding square-wave signal having suitable digital signal voltage levels. As previously mentioned, the amplitude regulation achievable in the high-performance crystal oscillator of Prior Art FIG. 1 is inadequate for high-performance silicon MEMS oscillators.

One reason this is true is that every millivolt of amplitude error in the AC signal being generated by the MEMS oscillator creates a significant shift in the oscillator frequency. Consequently, very accurate control of the amplitude of the oscillator output signal is needed to prevent a corresponding shift in the oscillator frequency. The embodiment of the invention shown in FIG. 2 accomplishes this with feedback control of a control current $I_{CONTROL}$ generated by circuitry including a synchronous rectifier 14, switched capacitor notch filter 15, and a bias voltage generator connected to the MEMS oscillator.

Figure 1:
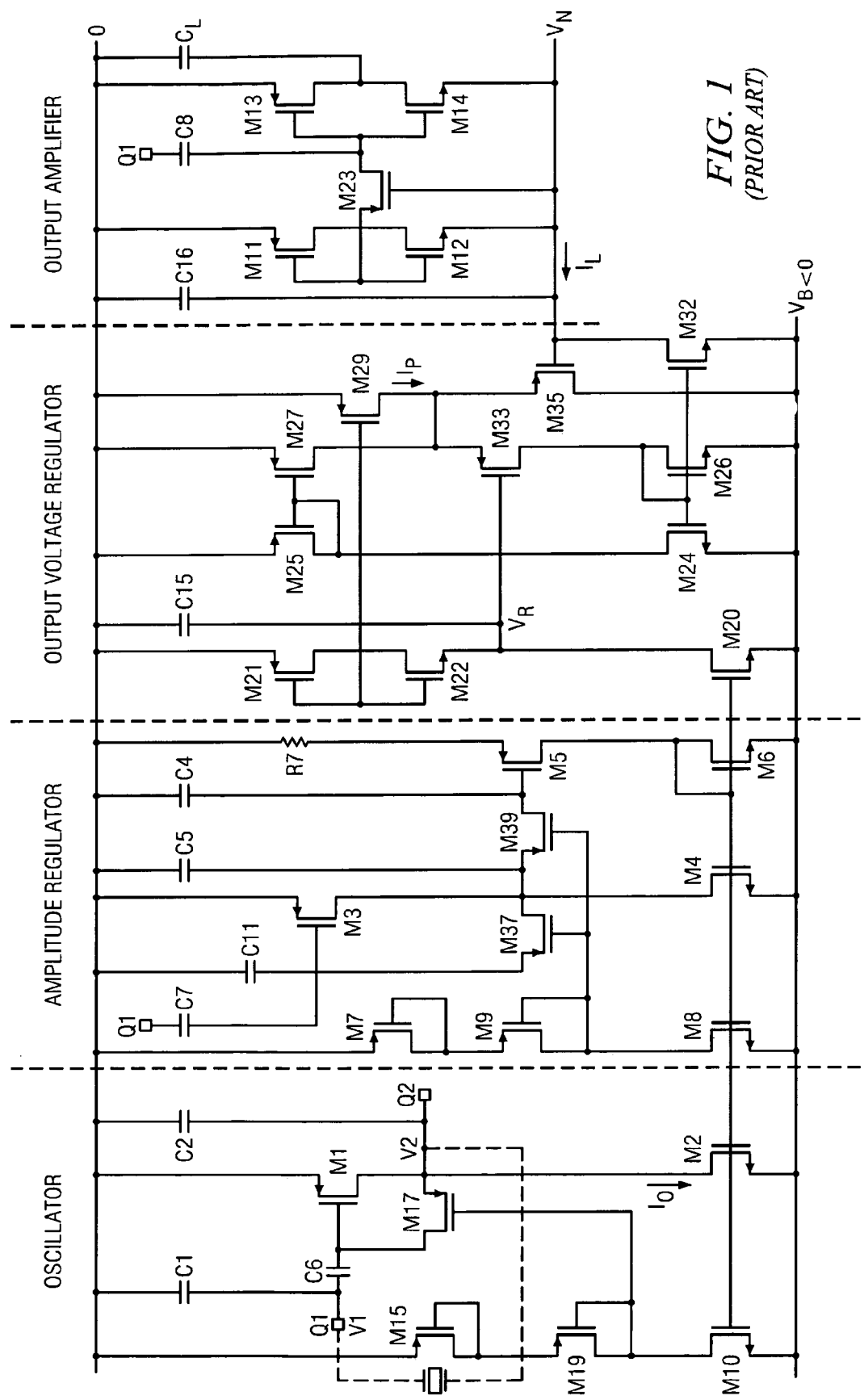
FIG. 1 is a schematic diagram of a conventional crystal oscillator circuit.

Another reason the amplitude regulation achievable in the high-performance crystal oscillators of Prior Art FIG. 1 is inadequate for high-performance silicon MEMS oscillators is that in order to achieve adequate amplitude control in a MEMS oscillator, extensive filtering would be required in the amplitude control loop to decrease harmonic content in the oscillator output signal. Such filtering would cause the compensation required for the amplitude control loop to be very complicated.

Figure 2:
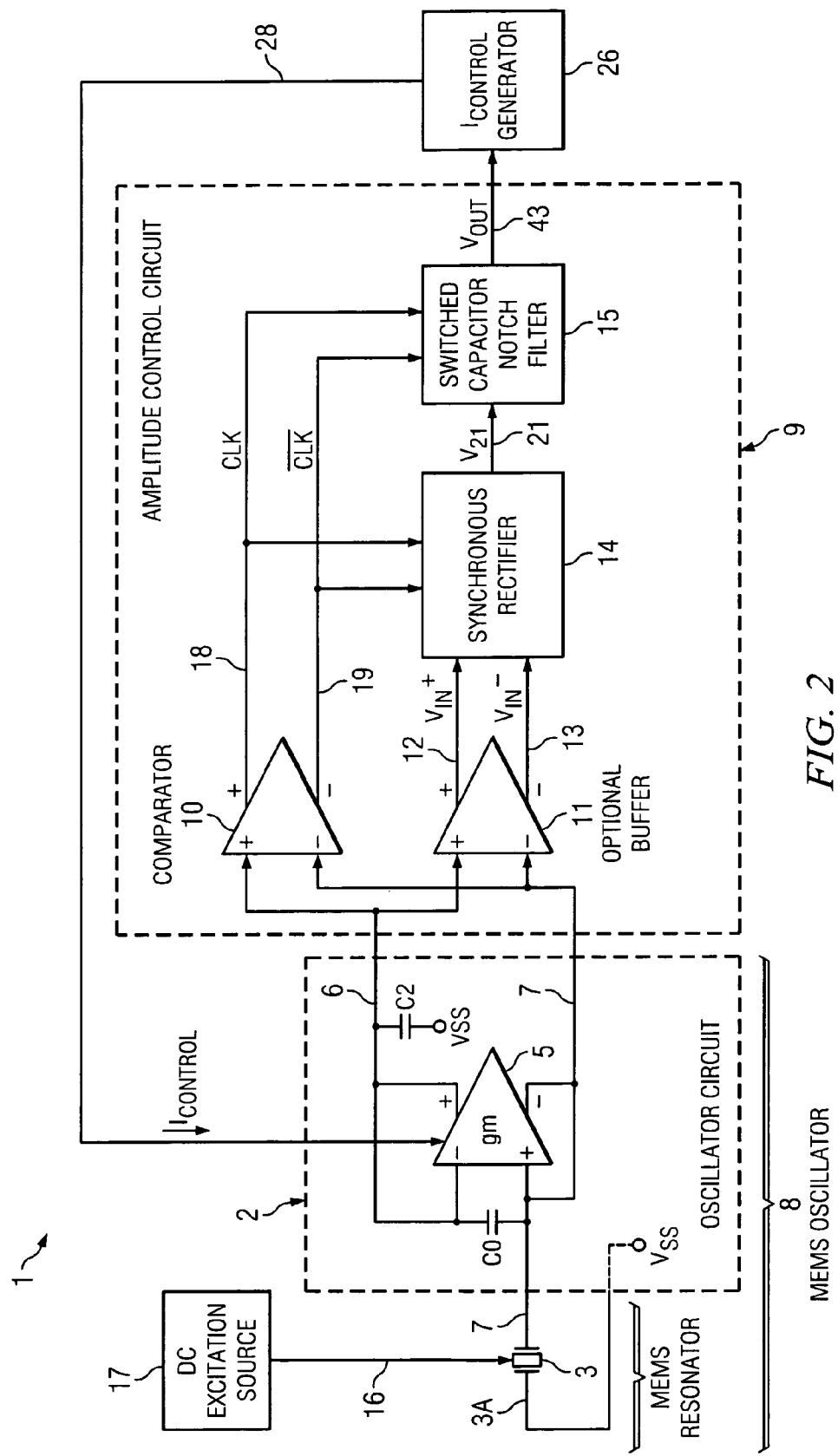
FIG. 2 is a block diagram a MEMS oscillator of the present invention.

FIG. 2 shows a high-performance MEMS oscillator 1 formed on a silicon integrated circuit chip fabricated using CMOS technology. High-performance MEMS oscillator 1 precisely controls the amplitude of a control current applied to control the transconductance of a transconductance stage of a MEMS oscillator so as improve the accuracy and stability of the oscillator frequency. In FIG. 2, high-performance MEMS oscillator 1 includes an oscillator circuit 2 coupled to one terminal 7 of a MEMS resonator 3 which is biased by a suitable bias voltage on another terminal 3A of MEMS resonator 3. Terminal 3A of MEMS resonator 3 is also coupled to oscillator circuit 2. In the example shown in FIG. 2, terminal 3A of MEMS resonator 3 may be connected to $V_{SS}$ inside oscillator circuit 2 as indicated by dashed lines. However, in other cases MEMS resonator 3 may be coupled differently, for example between the gate and drain of a transistor in transconductance amplifier 5. (For example, see the coupling of the resonator between the gate and drain of transistor M1 in Prior Art FIG. 1.) The circuitry 8 including MEMS resonator 3 and oscillator circuit 2 is referred to as "MEMS oscillator" 8.

In the example of FIG. 2, oscillator circuit 2 includes above mentioned transconductance amplifier 5 and also includes capacitors C0 and C2. Terminal 7 of MEMS' resonator 3 is connected to one terminal of capacitor C0 and the (+) input and (−) output of transconductance amplifier 5, and also to the (+) input of an optional buffer circuit 11. The other terminal of capacitor C0 is connected by conductor 6 to the (−) input of optional transconductance stage 5, the (+) output of transconductance stage 5, one terminal of capacitor C2, and the (+) input of buffer circuit 11. The other terminal of capacitor C2 is connected to $V_{SS}$. A bias current input of transconductance stage 5 is connected to conductor 28. (MEMS resonators require a DC bias voltage and a DC excitation signal to generate the electrostatic force associated with mechanical vibration in the MEMS resonator. See the prior art article "Reliability of Silicon Resonator Oscillators" by Wan-Thai Hsu, Discera Inc., Ann Arbor Mich. Also see the article "High-Frequency Micromechanical Filters, by" F. Bannon, J. Clark, and C. T. C. Nguyen, IEEE, J. Solid-State Circuits, Vol. 35, No. 4, pp. 512-526, April 2000.)

In oscillators including silicon MEMS resonators, the oscillation frequency, which depends on a DC excitation voltage on a conductor that may be a part of the MEMS resonator structure. (However, in some resonators the DC excitation voltage is applied to a conductor that is completely separate from the resonator.) In FIG. 2, the DC excitation voltage is produced on conductor 16 by a suitable excitation source 17 and is, in effect, summed with the AC signal being produced by MEMS oscillator 8; unfortunately, this causes amplitude-dependent shifts in the oscillation frequency.

An output of oscillator circuit 2 is coupled to optional buffer circuit 11, which is included in an amplitude control circuit 9. In response to the outputs of transconductance stage 5, amplitude control circuit 9 controls the amount of control current $I_{CONTROL}$ applied via conductor 28 to a bias input of transconductance stage 5 of MEMS oscillator 8. The (−) output of transconductance stage 5 is connected by conductor 7 to the (−) input of optional buffer circuit 11.

Amplitude control circuit 9 also includes a synchronous rectifier 14 having a first input coupled by conductor 12 to receive the signal $V_{IN}^{+}$ produced by the (+) output of optional buffer circuit 11. A second input of synchronous rectifier 14 is coupled by conductor 13 to receive the signal $V_{IN}^{-}$ produced by the (−) output of optional buffer circuit 11. Amplitude control circuit 9 also includes a comparator 10 and a switched capacitor notch filter 15. (Comparator 10 performs a comparison function that is somewhat similar to the function of the "Output Amplifier" in Prior Art FIG. 1.) The (+) and (−) inputs of comparator 10 are connected to conductors 6 and 7, respectively. The (+) output of comparator 10 is connected by conductor 18 to apply a clock signal CLK to both a first clock input of synchronous rectifier 14 and a first clock input of switched capacitor notch filter 15. The (−) output of comparator 10 produces the logical complement /CLK of clock signal CLK, and is connected by conductor 19 to apply the complement clock signal /CLK to both a second clock input of synchronous rectifier 14 and a second clock input of switched capacitor notch filter 15.

The output $V_{21}$ (or $I_{RECT}$ in FIG. 3) of synchronous rectifier 14 is applied via conductor 21 to the input of switched capacitor notch filter 15. The output $V_{OUT}$ on conductor 43 of switched capacitor notch filter 15 is applied to the input of a control current generator circuit 26. Control current generator circuit 26 generates the control current $I_{CONTROL}$ on conductor 28 and applies it to control the transconductance of oscillator circuit 2.

Preferably, oscillator circuit 2, comparator 10, optional buffer circuit 11, synchronous rectifier 14, switched-capacitor 15, and control current generator 26 are fabricated on the same integrated circuit chip using CMOS circuitry. Excitation signal source 17 also may be fabricated on the same chip using CMOS circuitry.

Figure 3:
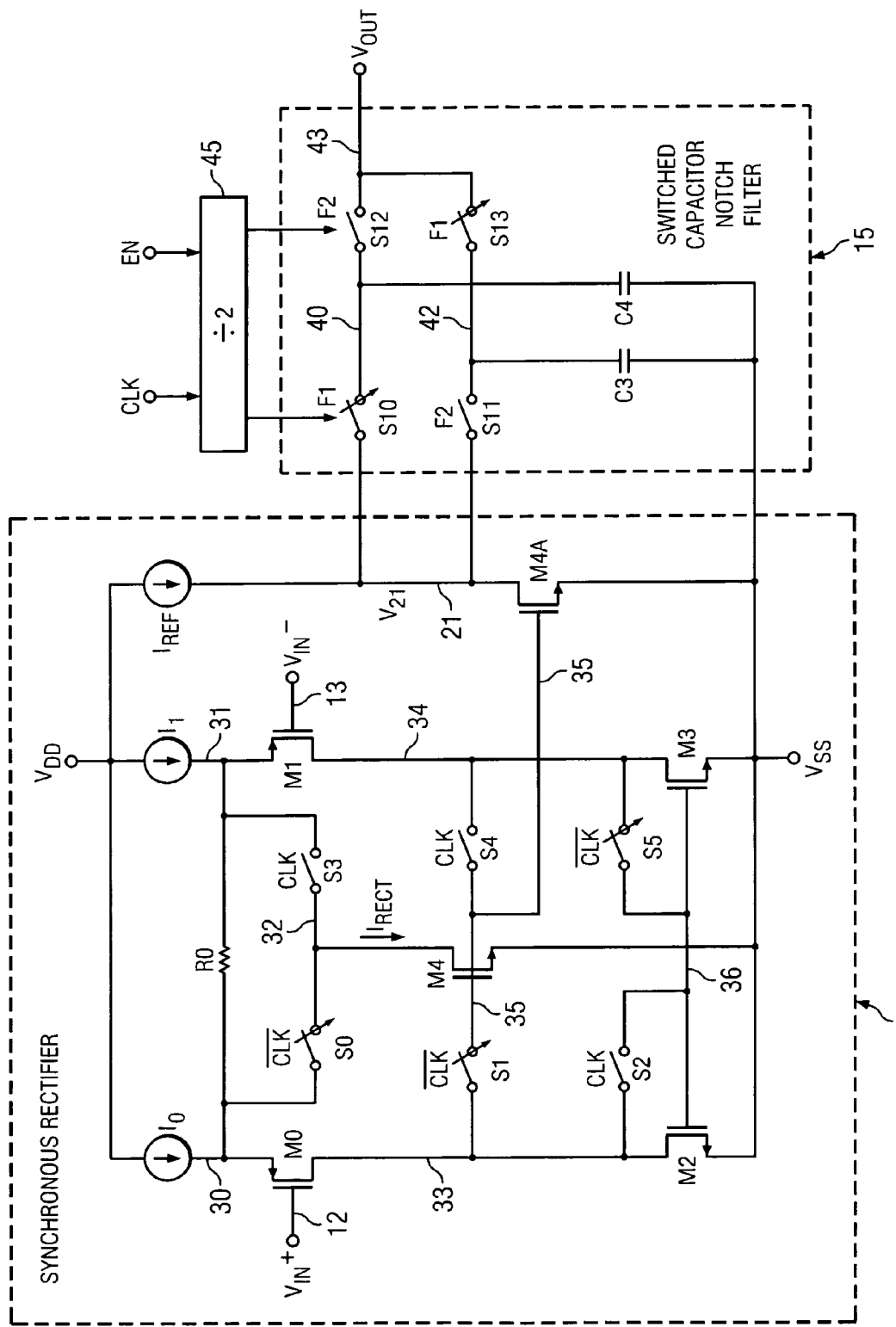
FIG. 3 is a schematic diagram of circuitry in blocks 14 and 15 in FIG. 2.

FIG. 3 shows details of synchronous rectifier 14 and switched capacitor notch filter 15 in FIG. 2. Synchronous rectifier 14 includes P-channel transistors M0 and M1, N-channel transistors M2, M3, M4, and M4A, and resistor R0, and also includes switches S0, S1, S2, S3, S4 and S5. The source of transistor M0 is coupled by conductor 30 to one terminal of a bias current source T0, one terminal of resistor R0, and one terminal of switch S0. The source of transistor M1 is coupled by conductor 31 to one terminal of a bias current source I1, the other terminal of resistor R0, and one terminal of switch S3. The other terminals of switches S0 and S3 are connected by conductor 32 to the drain of transistor M4. The drain of transistor M0 is connected by conductor 33 to one terminal of switch S1, one terminal of switch S2, and the drain of transistor M2. The drain of transistor M1 is connected by conductor 34 to one terminal of switch S4, one terminal of switch S5, and the drain of transistor M3.

The other terminals of switches S1 and S4 are connected by conductor 35 to the gates of transistors M4 and M4A, the sources of which are connected to $V_{SS}$. The drain of transistor M4A is connected by conductor 21 to one terminal of a current source $I_{REF}$. The other terminals of switches S2 and S5 are connected by conductor 36 to the gates of transistors M2 and M3, the sources of which are connected to $V_{SS}$. The other terminals of current sources I0, I1, and $I_{REF}$ are connected to $V_{DD}$.

The gate of transistor M0 receives the output signal $V_{IN}^{+}$ produced by optional buffer circuit 11, and the gate of transistor M1 receives the output signal $V_{IN}^{-}$ produced by buffer circuit 11. Switches S2, S3, and S4 are controlled by clock signal CLK, and switches S0, S1, and S5 are controlled by /CLK. A rectified current $I_{RECT}$ flows through the drain of transistor M4. Synchronous rectifier 14 bus functions as a voltage-to-current converter that provides the foregoing rectification.

Assuming that the various switches are in the open/closed configuration indicated in FIG. 3, transistor M4 provides feedback from the drain of transistor M0 to its gate. Therefore, if the current through transistor M2 were to become larger than the current through transistor M0, that would cause the gate voltage of transistor M4 to decrease, and that would decrease the current in transistor M0. Consequently, this feedback causes the currents in transistors M0 and M2 to always be equal during the part of the oscillator AC signal cycle in which the various switches are in the open and closed configuration shown in FIG. 3. Similarly, when the various switches are open/closed in the opposite way to the configurations illustrated in FIG. 3, the feedback through transistor M4 causes the currents in transistors M1 and M3 to be equal.

In FIG. 3, the sinusoidal input signal applied to synchronous rectifier 14 is equal to $V_{IN}^+ - V_{IN}^-$, and the various switches are controlled by the CLK and /CLK signals produced by comparator 10. During first half-wave of input signal $V_{IN}^+ - V_{IN}^-$, transistor M4 provides feedback around transistor M0, and the rectified current $I_{RECT}$ through transistor M4 is equal to $(V_{IN}^+ - V_{IN}^-)/R0$. Similarly, during the second half-wave of input signal $V_{IN}^+ - V_{IN}^-$ transistor M4 provides feedback around transistor M1, and the rectified current $I_{RECT}$ through transistor M4 is equal to $(V_{IN}^- - V_{IN}^+)/R0$. Thus, the current $I_{RECT}$ through transistor M4 is a rectified current which accurately represents the amplitude of the AC signal produced by MEMS oscillator 8.

The rectified current $I_{RECT}$ is mirrored through transistor M4A and is compared with the reference current $I_{REF}$, and the resulting signal on conductor 21 then is filtered by switched capacitor notch filter 15. The output of synchronous rectifier 15 consists of a sequence of the half sinewaves, and needs to be filtered to create a DC control current which is proportional to a mean value or amplitude of that sequence of half sinewaves. (Note that using an ordinary RC filter would create a low frequency pole that would make the amplitude control loop unstable, as subsequently explained.) The various switches in notch filter 15 are synchronized with the sine wave being generated by MEMS oscillator circuit 8 because of the operation of comparator 10.

Switched capacitor notch filter 15 in FIG. 3 includes switches S10, S11, S12, and S13 and capacitors C3 and C4. Output conductor 21 of synchronous rectifier 14 is connected to one terminal of each of switches S10 and S11. The other terminal of switch S10 is connected by conductor 40 to one terminal of capacitor C4 and one terminal of switch S12. The other terminal of switch S11 is connected by conductor 41 to one terminal of capacitor C3 and to one terminal of switch S13. The other terminals of switches S12 and S13 are connected to conductor 43, on which an output voltage $V_{OUT}$ is produced. The other terminals of capacitors C3 and C4 are connected to $V_{SS}$. Switches S10 and S13 are controlled by a clock signal F1, and switches S11 and S12 are controlled by a clock signal F2. Clock signal F1 and F2 are generated by a simple divide-by-2 circuit 45 in response to clock signal CLK and an enable signal EN. Note that clock signal F1 should be orthogonal to CLK, meaning that the integral of their product should be zero. Also, clock signal F2 should be orthogonal to /CLK. Divide-by-2 circuit 45 is the simplest way of obtaining F1 and F2 as signals that are orthogonal to CLK and /CLK, respectively.

Figure 5:
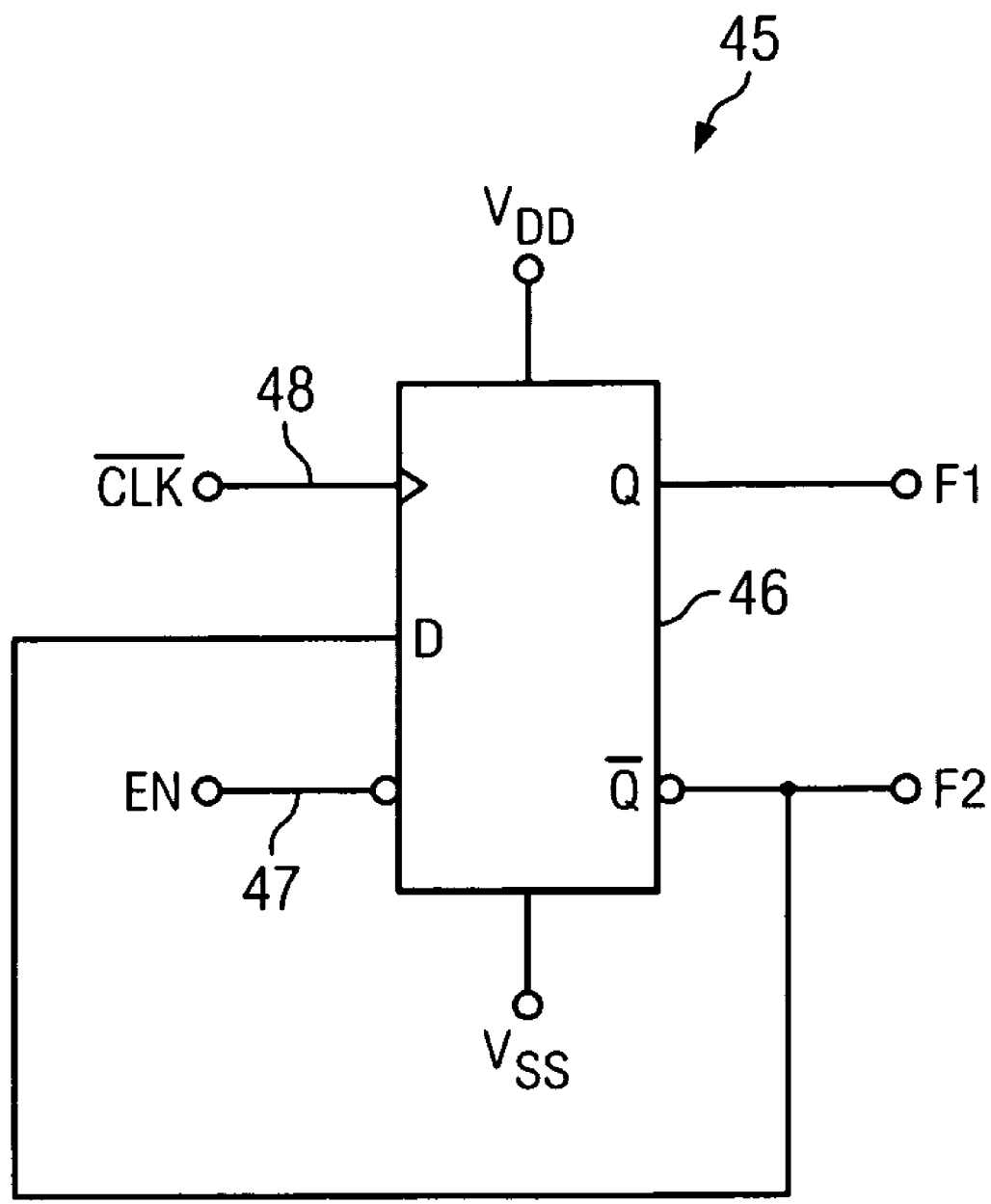
FIG. 5 is a logic diagram of a circuit for generating the clock signals F1 and F2 in FIG. 3.

An implementation of divide-by-2 circuit 45 is shown in FIG. 5, and includes a D-type flip-flop 46 which receives /CLK on its clock input and enable signal EN on its enable input 47. Clock signal F1 is produced on the Q output of flip-flop 46, and clock signal F2 is produced on the /Q output of flip-flop 46 and is coupled to the D input thereof.

Note that the delay through switched capacitor filter 15 is very small (i.e., one half of the period of CLK) and corresponds to a pole that is very small compared to what could be considered as a dominant pole of the oscillator. Switched capacitor notch filter 15 reduces the ripple voltage of the oscillator output signal to only a few millivolts. This is in sharp contrast to an RC filter that would need to have a very low frequency pole (and consequently a delay that would be roughly 100 to 1000 times greater than that of switched capacitor notch filter 15) in order to achieve such a low ripple voltage. The frequency of clock signals F1 and F2 may be an even multiple of the frequency of CLK (meaning that the frequency of clock signals F1 and F2 may be ½, ¼, ⅛ ... or 2, 4, 8 ... times the frequency of CLK).

Note that notch filter 15 as shown in FIG. 3 is a typical switched capacitor notch filter, somewhat as shown in commonly assigned U.S. Pat. No. 7,292,095 by Burt et al. (and also disclosed in the article "A Micropower Chopper-Stabilized Operational Amplifier using a SC Notch Filter with Synchronous Integration inside the Continuous Time Signal Path", Burt, R.; Zhang, J., JSSC vol. 41, December 2006, pp. 2729-2736).

Figure 4:
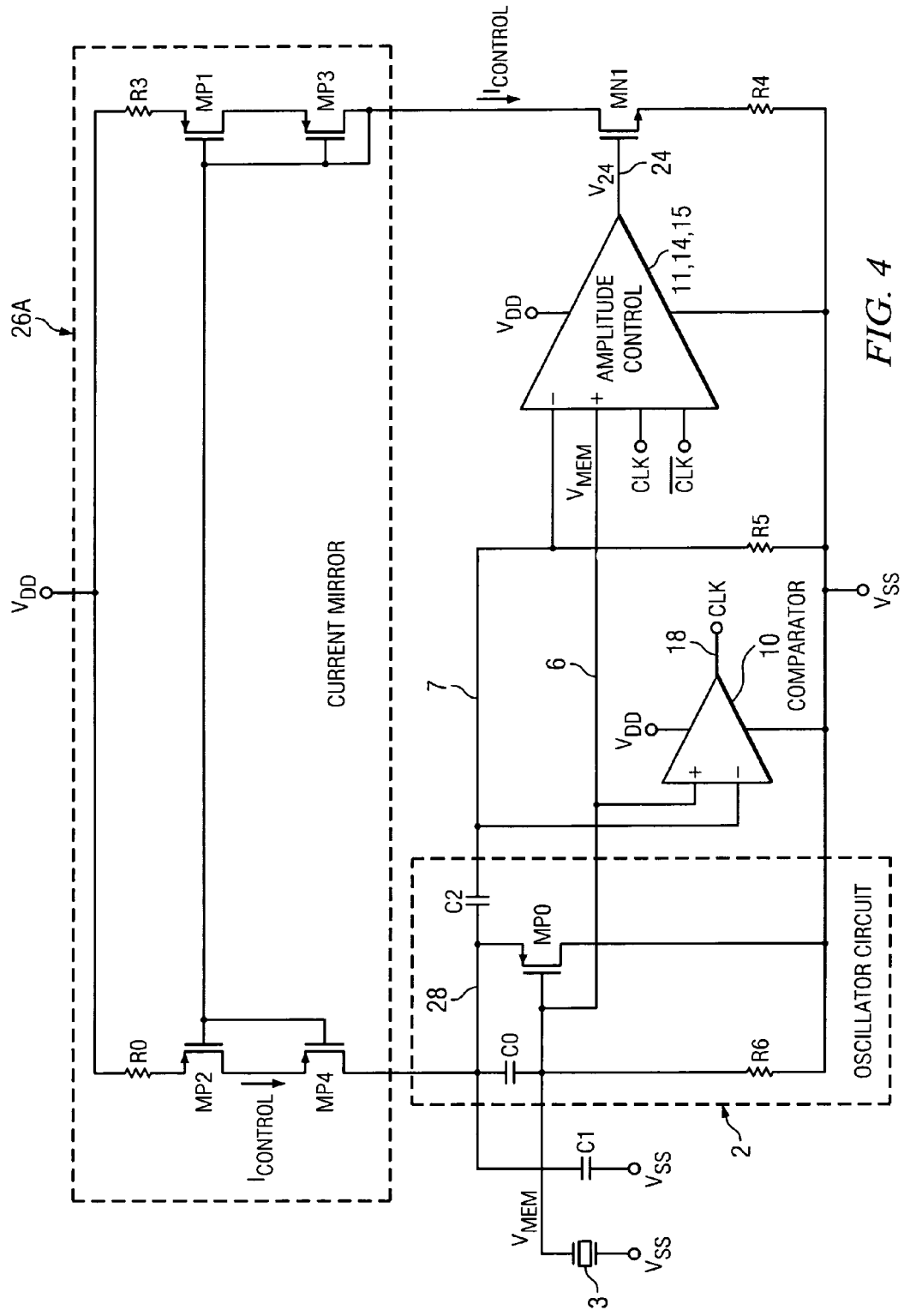
FIG. 4 is a another schematic diagram of the MEMS oscillator of FIG. 2.

FIG. 4 shows another schematic diagram of high-performance MEMS oscillator 1 of FIG. 2 which illustrates details of a current mirror 26A that is included in $V_{BIAS}$ generator 26 of FIG. 2. FIG. 4 also illustrates details of one implementation of oscillator circuit 2 in FIG. 2; several other implementations of oscillator circuit 2 also could be used. In FIG. 4, oscillator 2 includes a P-channel transistor MP0 having its source connected by conductor 28 to receive control current $I_{CONTROL}$. The source of transistor MP0 also is connected to the drain of a P-channel transistor MP4 of current mirror 26A, one terminal of a capacitor C0, and one terminal of a capacitor C2. The drain of transistor MP0 is connected to $V_{SS}$. Conductor 28 also is connected to one terminal of a capacitor C1, the other terminal of which is connected to $V_{SS}$.

The gate of transistor MP0 in oscillator circuit 2 is connected by conductor 6 to MEMS resonator 3, the (+) input of comparator 10, the (+) input of amplitude control circuit 11,14,15, the other terminal of capacitor C0, and to one terminal of a resistor R6, the other terminal of which is connected to $V_{SS}$. The other terminal of capacitor C2 is connected by conductor 7 to the (−) input of comparator 10, the (−) input of amplitude control circuit 11,14,15, and to one terminal of a resistor R5, the other terminal of which is connected to $V_{SS}$. Capacitor C2 and resistor R5 form a high frequency filter that prevents any DC signal from reaching the inputs of comparator 10 and amplitude control circuit 11,14,15.

Current mirror 26A in FIG. 4 is part of $I_{CONTROL}$ generator circuit 26 in FIG. 2. The source of above mentioned current mirror output transistor MP4 in FIG. 4 is connected to the drain of P-channel current mirror output transistor MP2, the source of which is coupled to $V_{DD}$ by a resistor R0. The gates of current mirror output transistors MP2 and MP4 are connected to the gates of P-channel current mirror input transistors MP1 and MP3. The source of transistor MP1 is coupled to $V_{DD}$ by resistor R3. The drain of transistor MP1 is connected to the source of transistor MP3, the gate and drain of which are connected to the drain of a N-channel output transistor MN1 that is included in $I_{CONTROL}$ generator 26 in FIG. 2. The gate of output transistor MN1 in FIG. 4 receives the output voltage $V_{24}$ that is generated on conductor 24 by amplitude control circuit 11,14,15. Transistor MN1 and resistor R4 in FIG. 4 also are included in $I_{CONTROL}$ generator 26 in FIG. 2. The source of transistor MN1 is coupled to $V_{SS}$ by resistor R4. The current $I_{CONTROL}$ flows through transistor MN1 and current mirror input transistors MP1 and MP3, and therefore is mirrored to flow through current mirror output transistors MP2 and MP4 into conductor 28 to control the transconductance of transistor MP0.

Synchronous regulator 14 and switched capacitor notch filter 15 cause current mirror 26A to regulate the amplitude of the oscillator signal on conductor 28, and consequently they also regulate the voltage across capacitor C0 and the current through MEMS resonator 3.

The above described high-performance MEMS oscillator provides much more accurate and stable oscillator frequency than has been achievable in the MEMS oscillators of the prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, different connections could be provided to connect the resonator to oscillators other than the oscillator shown in the described embodiments. The described circuitry can be used to control the transconductance of the oscillator circuitry regardless of the kind of resonator that is utilized.

What is claimed is:

1. An oscillator comprising:
    (a) oscillator circuitry including an amplifying circuit having first and second outputs and also including a resonator having a first terminal for receiving a bias signal;
    (b) a comparator having first and second inputs coupled to the first and second outputs, respectively, of the amplifying circuit for producing first and second clock signals which indicate the timing of positive and negative phases of a differential output signal produced by the amplifying circuit;
    (c) a synchronous rectifier having first and second inputs coupled to receive first and second output signals that are produced in response to the first and second outputs of the amplifying circuit, the synchronous rectifier having first and second clock inputs coupled to receive the first and second clock signals, respectively;
    (d) a switched capacitor notch filter having an input coupled to an output of the synchronous rectifier, the switched capacitor notch filter having first and second clock inputs coupled to receive the first and second clock signals, respectively; and
    (e) a control current generator having an input coupled to an output of the switched capacitor notch filter, for generating a control current which controls the transconductance of the amplifying circuit.

2. The oscillator of claim 1 wherein the resonator is a MEMS (micro electromechanical system) resonator.

3. The oscillator of claim 2 wherein the amplifying circuit includes a transconductance stage having a first input coupled to a first terminal of a first capacitor and a second terminal of the MEMS resonator and a second input coupled to a second terminal of the first capacitor and the first output of the amplifying circuit.

4. The oscillator of claim 3 including a buffer circuit having first and second inputs coupled to the first and second outputs, respectively, of the amplifying circuit for producing the first and second output signals.

5. The oscillator of claim 2 wherein the synchronous rectifier includes first, second, third, fourth, fifth, and sixth transistors and first, second, third, fourth, fifth and sixth switches, the first transistor having a gate coupled to receive the first output signal, a source coupled to a first current source, a first terminal of a resistor, and a first terminal of the first switch, and a drain coupled to a first terminal of the second switch, a first terminal of the third switch, and a drain of the third transistor, a source of the third transistor being coupled to a supply voltage,
the second transistor having a gate coupled to receive the second output signal, a source coupled to a second current source, a second terminal of the resistor, and a first terminal of the fourth switch, and a drain coupled to a first terminal of the fifth switch, a first terminal of the sixth switch, and a drain of the fourth transistor, a source of the fourth transistor being coupled to the supply voltage,
second terminals of the first and fourth switches being coupled to a drain of the fifth transistor, second terminals of the third and sixth switches being coupled to gates of the third and fourth transistors, second terminals of the second and fifth switches being coupled to gates of the fifth and sixth transistors, sources of the fifth and sixth transistors transistor being coupled to the supply voltage,
a drain of the sixth transistor being coupled by an output conductor to one terminal of a reference current source, and
the third, fourth and fifth switches being controlled by the first clock signal, the first, second, and sixth switches being controlled by the second clock signal.

6. The oscillator of claim 5 wherein the notch filter includes seventh, eighth, ninth, and tenth switches, the output of the synchronous rectifier being coupled to a first terminal of each of the seventh and eighth switches, a second terminal of the seventh switch being coupled to a first terminal of the ninth switch and a first terminal of a first capacitor, a second terminal of the eighth switch being coupled to a first terminal of the tenth switch and a second capacitor, second terminals of the ninth and tenth switches being coupled to an output conductor of the switched capacitor notch filter, the seventh and tenth switches being controlled by a third clock signal, the eighth and ninth switches being controlled by a fourth clock signal, the frequency of the third and fourth clock signals being half the frequency of the first and second clock signals, wherein the third clock signal is orthogonal to the first clock signal and the fourth clock signal is orthogonal to the second clock signal.

7. The oscillator of claim 2 wherein the notch filter includes first, second, third, and fourth switches, the output of the synchronous rectifier being coupled to a first terminal of each of the first and second switches, a second terminal of the first switch being coupled to a first terminal of the third switch and a first terminal of a first capacitor, a second terminal of the second switch being coupled to a first terminal of the fourth switch and a second capacitor, second terminals of the third and fourth switches being coupled to an output conductor of the switched capacitor notch filter, the first and fourth switches being controlled by a third clock signal, the second and third switches being controlled by a fourth clock signal, the frequency of the third and fourth clock signals being half the frequency of the first and second clock signals, wherein the third clock signal is orthogonal to the first clock signal and the fourth clock signal is orthogonal to the second clock signal.

8. The oscillator of claim 7 including a divide-by-two circuit including a flip-flop having a clock input coupled to receive the second clock signal, an enable input, a Q output on which the third clock signal is produced, and a /Q output on which the fourth clock signal is produced, the /Q output being coupled to a D input of the flip-flop.

9. The oscillator of claim 2 wherein the control current generator includes an output transistor having a gate coupled to an output of the switched capacitor notch filter, a source coupled by a resistor to a supply voltage, and a current mirror having an input coupled to a drain of the output transistor, and also includes an output coupled to control the transconductance of the amplifying circuit.

10. The oscillator of claim 9 wherein the amplifying circuit includes a first transistor having a source coupled to receive the control current.

11. The oscillator of claim 10 wherein the output transistor is an N-channel transistor and the first transistor is a P-channel transistor.

12. The oscillator of claim 2 wherein MEMS resonator, the amplifying circuit, the comparator, the synchronous rectifier, the switched capacitor notch filter, and the control current generator all are fabricated on an integrated circuit chip.

13. The oscillator of claim 1 wherein the second clock signal is the logical complement of the first clock signal.

14. The oscillator of claim 2 wherein the MEMS resonator is a silicon MEMS resonator.

15. A method for controlling variation of an oscillator signal frequency, the method comprising:
(a) producing an AC signal between first and second outputs of an amplifying circuit in response to a resonator having a first terminal coupled to an input of the amplifying circuit;
(b) generating complementary first and second clock signals which indicate the timing of positive and negative phases of a differential output signal produced in response to the amplifying circuit by comparing signals on the first and second outputs of the amplifying circuit;
(c) synchronously rectifying the differential output signal in response to the first and second clock signals to produce a rectified signal representative of the amplitude of the AC signal;
(d) filtering the rectified signal by means of a switched capacitor notch filter in response to third and fourth complementary clock signals each having a frequency that is half of a frequency of the first clock signal; and
(e) generating a control current in response to a filtered signal generated by the filtering and applying the control current to the amplifying circuit to control the transconductance of the amplifying circuit.

16. The method of claim 15 wherein step (a) includes providing the resonator as a MEMS (micro electromechanical system) resonator.

17. The method of claim 15 wherein step (d) includes providing a flip-flop having a clock input coupled to receive the second clock signal, an enable input, a Q output on which the third clock signal is produced, and a /Q output on which the fourth clock signal is produced, the /Q output being coupled to a D input of the flip-flop.

18. The method of claim 16 including fabricating the MEMS resonator, the amplifying circuit, the comparator, the synchronous rectifier, the switched capacitor notch filter, and the control current generator all on a silicon integrated circuit chip.

19. The method of claim 15 wherein step (e) includes generating the control current by means of an output transistor having a gate coupled to an output of the switched capacitor notch filter and a current mirror having an input coupled to a drain of the output transistor and an output coupled to a source of a transistor in the amplifying circuit.

20. An oscillator including circuitry for controlling variation of an oscillator signal frequency, comprising:
(a) means for producing an AC signal between first and second outputs of an amplifying circuit in response to a resonator having a first terminal coupled to an input of the amplifying circuit;
(b) means for generating complementary first and second clock signals which indicate the timing of positive and negative phases of a differential output signal produced in response to the amplifying circuit by comparing signals on the first and second outputs of the amplifying circuit;
(c) means for synchronously rectifying the differential output signal in response to the first and second clock signals to produce a rectified signal representative of the amplitude of the AC signal;
(d) means for filtering the rectified signal by means of a switched capacitor notch filter in response to third and fourth complementary clock signals at a frequency that is half of a frequency of the first clock signal; and
(e) means for generating a control current in response to a filtered signal generated by the filtering and applying the control current to the amplifying circuit to control the transconductance of the amplifying circuit.

* * * * *